United States Patent [19]

Troy

[11] 3,754,185

[45] Aug. 21, 1973

[54] AUDIO FREQUENCY SWEEP GENERATOR

[76] Inventor: Stephen R. Troy, 104-20 89th Ave. Richmond Hill, N.Y. 11418

[22] Filed: May 17, 1972

[21] Appl. No.: 254,138

[52] U.S. Cl. .......... 324/57 R

[51] Int. Cl. .......... G01r 27/00

[58] Field of Search .......... 324/57 R, 57 PS

[56] References Cited

UNITED STATES PATENTS

| | | | |
|---|---|---|---|
| 3,141,130 | 7/1964 | Hilliard | 324/57 R X |
| 3,379,975 | 4/1968 | Niedereder | 324/57 R X |
| 3,513,385 | 5/1970 | Pascoe | 324/57 R |

*Primary Examiner*—Stanley T. Krawczewicz
*Attorney*—Harry A. Herbert, Jr. et al.

[57] ABSTRACT

An audio frequency sweep generator which generates a pulse waveform of essentially constant energy per pulse, at a swept pulse repetition rate. Unijunction transistors are utilized in the oscillators which vastly improves these circuits and further simplify the attainment of a linear change of frequency with time in the swept oscillator. Furthermore, by the use of post-marker injection employing stable LC wave traps, marker pulses at various frequencies are provided to permit accurate, dependable calibration of a trace directly on an oscilloscope screen.

10 Claims, 3 Drawing Figures

AUDIO FREQUENCY SWEEP GENERATOR

BACKGROUND OF THE INVENTION

This invention relates generally to audio frequency sweep generators and, more particularly, to an audio frequency sweep generator which incorporates therein unijunction transistors in the oscillators and a post-marker injection system.

The audio frequency sweep generator is an electronic instrument, used primarily with an oscilloscope or oscillograph to provide a pictorial display of the audio frequency response of a device under test. The audio frequency sweep generator finds its greatest utility in the design, testing, maintenance and repair of audio frequency electronic equipment such as telephone, teletype, tone modulated telemetry, public address and high fidelity equipment, and in the audio frequency portions of radios, televisions, sonar and the like.

In use the audio frequency sweep generator generates an audio frequency electrical signal which starts at an adjustable lower frequency limit, maintaining a constant, adjustable, amplitude as it sweeps linearly with time and at an adjustable rate, to an adjustable upper frequency. The signal then returns rapidly to the lower frequency limit and repeats the process. This signal is fed into a device under test with the resultant output fed back into the sweep generator for subsequent display on an oscilloscope.

Heretofore, audio frequency sweep generators were extremely costly and complex because of their basic design philosophy which is to:

1. Develop a sinusoidal oscillator producing a pure output;
2. Make this output sweep in frequency while maintaining the purity; and
3. Provide long-term frequency calibration of the output.

The design of existing audio frequency sweep generators starts with a conventional linear sine wave oscillator. Once a pure sine wave output is generated, one or more frequency-determining variables are modified by a control voltage, so the signal can be swept. This approach has the following drawbacks:

1. The measures taken to get a pure sine wave output tend to make the oscillator resist changes in frequency, and the change in frequency tends to be a highly nonlinear function of control voltage;
2. The amplitude of the sine wave oscillator output varies drastically as the frequency is changed;
3. To control problems 1 and 2 set forth above, corrective circuitry is required, which greatly increases the complexity; and
4. All this circuitry requires many precision components.

Furthermore, existing sweep generators rely on an accurate calibration of their front-panel frequency dials to indicate their center frequency and sweep width. This arrangement is unsatisfactory because:

1. The markings on simple dials cannot be read with any great accuracy, while more elaborate dials which can be read accurately, such as vernier types, are expensive and complicated;
2. Frequent calibration is needed to make actual output frequency agree with dial markings, due to drift; and 3. No other indication of the instantaneous output frequency is available, making oscilloscope or other displays difficult to interpret.

It therefore clearly is evident that although audio frequency sweep generators of the past could be utilized to test electronic equipment, they presented many problems in operation as well as a great expense in construction and maintenance.

SUMMARY OF THE INVENTION

The instant invention sets forth an audio frequency sweep generator which overcomes the problems set forth hereinabove.

The audio frequency sweep generator of the present invention differs from the conventional audio frequency sweep generator in two major areas:

1. The instant invention utilizes unijunction transistor multivibrators, while heretofore existing devices use linear sine wave oscillators, and
2. The instant invention utilizes post-marker injection to indicate frequencies generated, while existing devices rely on dial calibration.

In contrast to the sweep generators of the past, the unijunction transistor multivibrator puts out a pulse waveform, which can be processed to yield the desired sine wave. Such a system differs from the linear sine wave oscillator in that it can easily be swept in frequency, and the change in frequency is linear with the control voltage in a properly designed circuit, as is incorporated in this invention.

Furthermore, the amplitude of the pulse output, and thus that of the sine wave derived from it, is intrinsically nearly constant in the frequency range being considered. Because of these intrinsic features, no corrective circuitry is required with the instant invention and fewer components, particularly precision components, are needed. Thus the instant device is simple, compact, reliable, and inexpensive compared to existing devices.

The sweep generator of this invention also incorporates therewith post-marker injection to show the output frequency. Pulses are produced when the output frequency coincides with the resonant frequency of switch-selectable, stable, passive tuned circuits. These pulses are mixed with the signal from the device under test, giving a clear, unambiguous indication of instantaneous output frequency. In this manner, the oscilloscope display can be read directly in terms of response as a function of frequency.

It is therefore evident that the output frequency can be read with great accuracy, since the change in frequency is linear with the oscilloscope sweep voltage provided, and accurate, easily-identifiable marker pulses are provided, making it easy to interpolate on the oscilloscope display. Stable, passive tuned circuits are used to provide marker pulses, which are thus independent of any drift in the sweep generator. There is thus no need for frequent re-calibration as in existing devices. As a result, in addition to being simple and inexpensive to build, this invention will be simple and inexpensive to operate and maintain. The marker pulses depend only on the instantaneous output frequency. Thus the operator of this invention can shift, expand or contract the display at will, to examine various features of the display, and still maintain the same ease of frequency determination.

It is therefore an object of this invention to provide an audio frequency sweep generator which can quickly determine the response of an unstable device under test as it drifts.

It is another object of this invention to provdide an audio frequency sweep generator which is capable of measuring the response of an unstable device under test before it has a chance to drift.

It is a further object of this invention to provide an audio frequency sweep generator in which the effect of tuning adjustments to the device under test can be easily seen.

It is still another object of this invention to provide an audio frequency sweep generator which is highly reliable in operation and extremely economical to mass produce and maintain.

For a better understanding of the present invention together with other and further objects thereof, reference is made to the following description taken in connection with the accompanying drawing and its scope will be pointed out in the appended claims.

DETAILED DESCRIPTION OF THE PREFERRED EMBODIMENT

Figure 1:
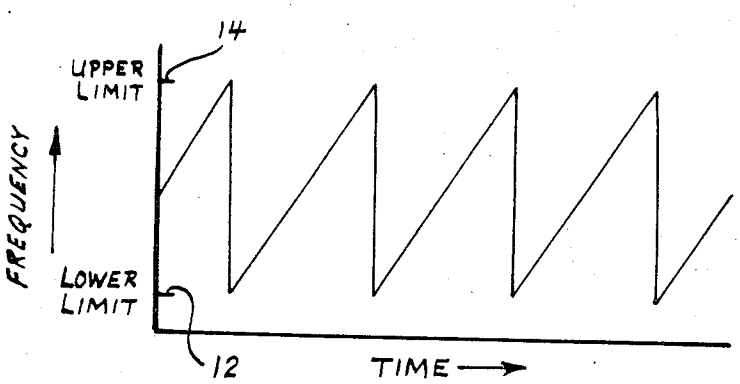
FIG. 1 is a graph representing the audio frequency electrical signal produced by the audio frequency sweep generator of this invention.
Figure 2:
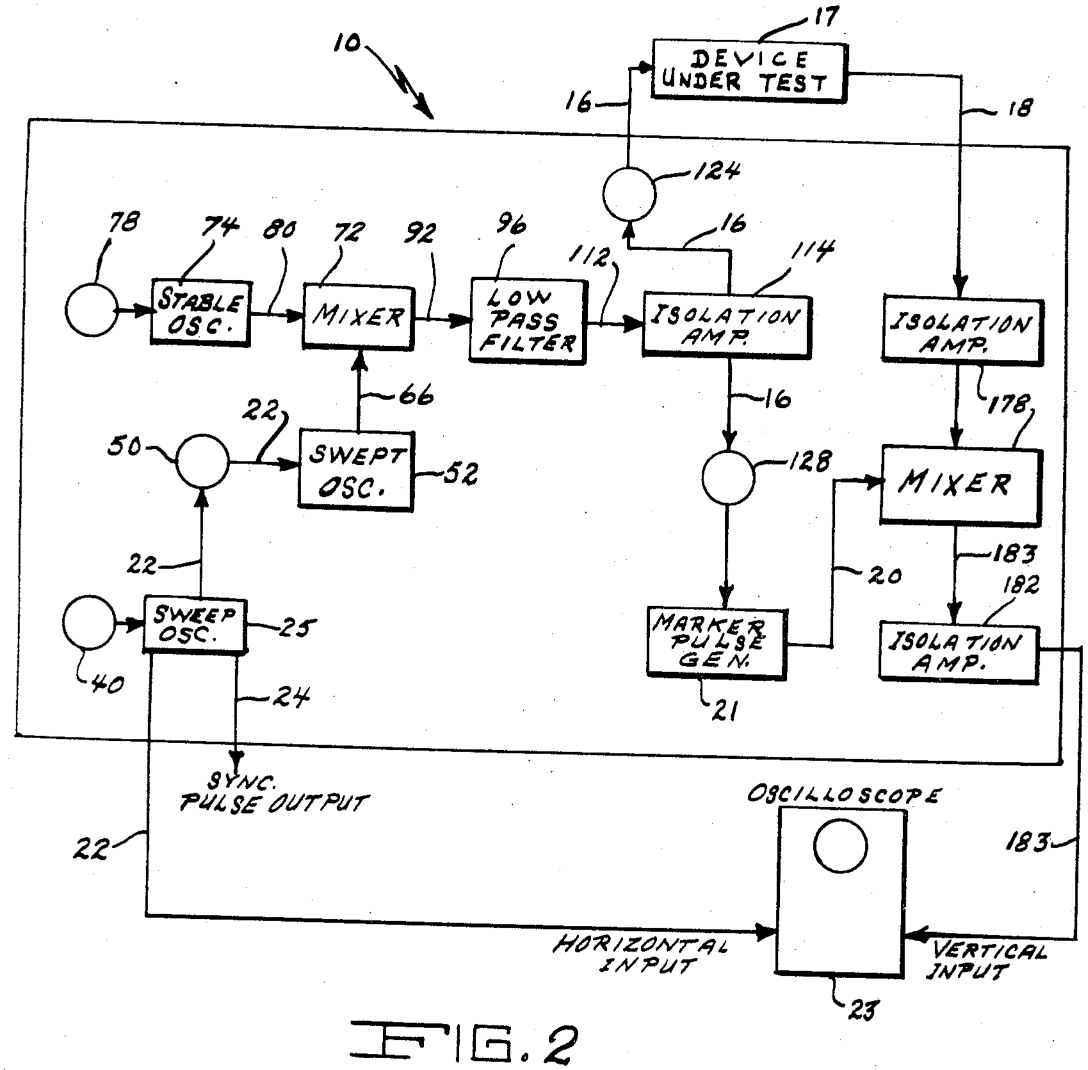
FIG. 2 is a block diagram of the audio frequency sweep generator of this invention shown in conjunction with a device under test.

Reference is now made to FIG. 1 of the drawing which shows the audio frequency electrical signal which is generated by the audio frequency sweep generator 10 of this invention. This signal starts at an adjustable lower frequency limit 12 and maintains a constant adjustable, amplitude as it sweeps linearly with time and at an adjustable rate, to an adjustable upper frequency limit 14, and then returns rapidly to the lower frequency limit 12, constantly repeating this process. This signal 16 as shown in FIG. 2 of the drawing is fed into any suitable device 17 under test. The resulting output 18 is fed back into the sweep generator 10. Within sweep generator 10, signal 18 is combined with signal 20 from a marker pulse generator 21. The marker pulse generator 21 is an integral part of the sweep generator 10 of the instant invention and produces momentary pulses at certain selected frequencies when the sweep generator 10 passes through these frequencies. These pulses permit calibration of the frequency axis of the graphical display such as an oscilloscope 23 in a manner to be described in detail hereinbelow. This specific method, known as post-marker injection, insures that the calibration pulses will be visible even if the device 17 under test causes severe attenuation at their frequencies.

The signal 18 from device 17 is amplified, combined with marker pulses 20, and fed to the vertical input of oscilloscope 23. The ramp voltage 22 put out by the sweep oscillator 25 of this invention is fed to the horizontal input of oscilloscope 23; or depending on the type of oscilloscope used, a sync pulse 24 is available for triggering the oscilloscope's internal horizontal sweep generator.

Figure 3:
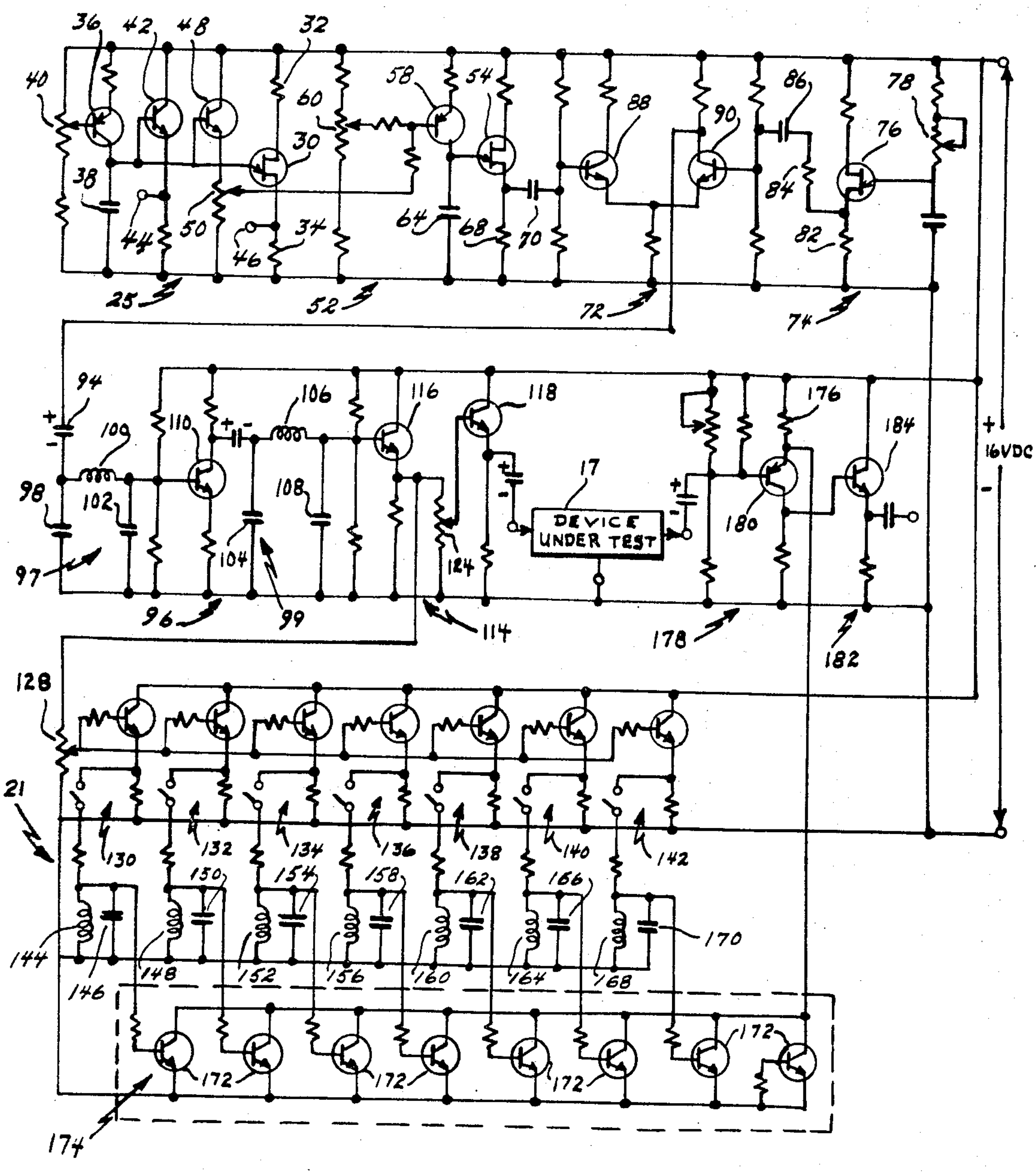
FIG. 3 is a schematic diagram of the audio frequency sweep generator of this invention shown in conjunction with a device under test.

Referring now to FIG. 3 of the drawing, a schematic diagram 26 is utilized to more specifically define the circuitry of the audio frequency sweep generator 10 of the instant invention. The sweep oscillator 25 has therein a unijunction transistor 30 which is biased by resistors 32 and 34 to conduct when its emitter rises to a particular positive firing voltage. Transistor 36 acts as a high output impedance current source, and charges capacitor 38 with a constant current, which is controlled by the setting of the sweep rate potentiometer 40. Since capacitor 38 is charged by a constant current, the voltage across it is a linearly rising ramp. When this ramp rises to the firing voltage of unijunction transistor 30, transistor 30 conducts, rapidly discharging capacitor 38 through resistor 34. The cycle then begins again. The sweep rate can be varied, using potentiometer 40 from a minimum of approximately one-fifth Hz to a maximum of approximately 30 Hz.

The sweep ramp voltage 22 across capacitor 38 is buffered by transistor 42 and brought out at jack 44. There voltage 22 can be used for the horizontal input (See FIG. 2) of an oscilloscope 23, X-Y recorder, or other appropriate display recording instrument. A sync pulse 24 (See FIG. 2), generated across resistor 34 each time capacitor 38 discharges through it, is available at jack 46, if desired, to synchronize a triggered-sweep oscilloscope or other instrument. The sweep ramp voltage 22 is also buffered by transistor 48 and fed to potentiometer 50, which feeds a portion of this signal to a swept oscillator 52.

In the swept oscillator 52, unijunction transistor 54 and its associated circuitry form a free-running multivibrator, with transistor 58 acting as a variable resistor to control the multivibrator's frequency. The effective resistance of transistor 58 is basically set by the adjustment of trimmer potentiometer 60, and then varied by the ramp voltage 22 from sweep oscillator 25. The amplitude of the ramp voltage 22 fed to the swept oscillator 52, and therefore the frequency sweep of oscillator 52, is determined by the setting of sweep width potentiometer 50. With the component values given, the swept oscillator 52 is set to a basic frequency of approximately 100 KHz, and with potentiometer 50 at its maximum setting, is swept down to approximately 70 KHz.

Since the frequency of the swept oscillator 52 is proportional to the current from transistor 58 charging capacitor 64, and since this current is approximately proportional to the voltage at the base of transistor 58, and further since this voltage varies linearly with time, the frequency of swept oscillator 52 varies approximately linearly, with time. The output 66 (See FIG. 2) of the swept oscillator 52 is a pulse waveform, taken across resistor 68, and fed through capacitor 70 to one input of mixer 72.

The stable oscillator 74 which includes unijunction transistor 76 and its associated circuitry also forms a free-running multivibrator whose frequency is determined by the setting of potentiometer 78, the center frequency control. This frequency is nominally 100 KHz. The output 80 of stable oscillator 74 is a pulse waveform taken across resistor 82 and fed through resistor 84 and capacitor 86 into the other input of the mixer 72 (See FIG. 2).

As shown in FIG. 3, mixer 72 utilizes transistors 88 and 90 and their associated circuitry to form a simple differential amplifier. Since it is biased for nonlinear operation, the output 92, taken at the collector of transistor 90, contains signal components at the frequency of the swept oscillator 52, the frequency of the stable oscillator 74, their sum and difference frequencies, and harmonics of these frequencies. Output 92 is fed through capacitor 94 to the low pass filter 96 as shown in FIG. 2.

The low pass filter 96 comprises of two pi sections 97 and 99, the first section 97, made of capacitor 98, inductor 100 and capacitor 102, and the second section 99, made of capacitor 104, inductor 106 and capacitor 108. Transistor 110 serves as a buffer between the two sections 97 and 99. Both low pass sections 97 and 99 cut off at approximately 50 KHz. Of the complex signal 92 fed from the mixer 72 to the low pass filter 96, only the difference frequency component, the signal whose frequency equals the difference between the frequencies of the stable oscillator 74 and the swept oscillator 52, falls below this cut off frequency. Therefore only the difference frequency component passes through filter 96, and is now the audio frequency sweep signal 112, which is then fed to the isolation amplifier 114 (See FIG. 2).

Transistors 116 and 118 make up the isolation amplifier 114 which maintains a proper load impedance for the low pass filter 96, and provides a low impedance source of the audio sweep signal 112 to be fed to the marker pulse generator 21 and to the device 17 under test. Potentiometer 124 controls the amplitude of the sweep signal 16 fed to the device 17 under test.

The audio sweep signal 16 is also fed from the isolation amplifier 114 to the marker pulse generator 21 through potentiometer 128, the marker pulse level control. The marker pulse generator 21 contains seven channels 130, 132, 134, 136, 138, 140, 142, respectively, each of which can be switched on or off independently of the others, and are identical except for the resonant frequencies of their tuned circuits. For example, these resonant frequencies may be:

1. Inductor 144 and capacitor 146 — 250 Hz;
2. Inductor 148 and capacitor 150 — 500 Hz;
3. Inductor 152 and capacitor 154 — 1 KHz;
4. Inductor 156 and capacitor 158 — 2.5 KHz;
5. Inductor 160 and capacitor 162 — 5 KHz;
6. Inductor 164 and capacitor 166 — 10 KHz; and
7. Inductor 168 and capacitor 170 — 25 KHz.

When one of the channels 130, 132, 134, 136, 138, 140 or 142 is switched off, it does nothing. When it is switched on, but the audio sweep signal 16 is far from its tuned circuit's resonant frequency, the voltage across the tuned circuit is negligible. As the audio sweep signal 16 moves across the resonant frequency, however, the voltage across the tuned circuit rises to a sharp peak and then drops again. Because of the tuned circuit's high Q factor, this peak is very narrow. This resonance peak is sensed, amplified, and further narrowed by one of the gate transistors 172 in digital integrated circuit 174. The net result is that, whenever any of the channels is switched on, a sharp negative-going pulse 20 is generated across resistor 176 whenever the audio sweep signal 16 passes its resonant frequency. These pulses 20 are incorporated into the final display by being fed into the isolation amplifier/mixer 178, whose operation will be explained hereinbelow. It is convenient to note here, however, that the pulse 20, visible in the final display, caused when the audio sweep signal 16 passes through the resonant frequency of an active channel, can easily be identified by switching that channel off and on a few times. This marks the frequency of that position on the display. Since this can easily be done for several channels, marking the frequency of several points, the display's frequency axis can easiy be calibrated.

The isolation amplifier/mixer 178 stage of the invention is made up of transistor 180 and its bias networks, and is a simple class A audio amplifier stage. Its purpose is to provide a moderately high load impedance for the device 17 under test, and to provide a moderate voltage gain (approximately 5), to allow for attenuation in the device 17 under test. In addition, as described above, whenever the audio sweep signal 16 passes the resonant frequency of an active marker pulse generator channel, circuit 174 generates a narrow negative-going pulse 20 across resistor 176, the emitter resistor of transistor 180. This drives transistor 180 into cutoff, producing a corresponding negative-going pulse at the collector of transistor 180. These pulses are thus combined with the amplified output 18 from the device 17 under test, forming the final output signal 183 which is fed into the vertical input of oscilloscope 23. The output isolation amplifier 182 as its name implies, comprises of an emitter follower 184, and serves to provide an output buffer, making the operation of this invention relatively independent of the input impedance of display device 23.

Although this invention has been described with reference to a particular embodiment, it will be understood to those skilled in the art that this invention is also capable of a variety of alternate embodiments within the spirit and scope of the appended claims.

I claim:

1. An audio frequency sweep generator comprising means for producing a sweep ramp voltage, first means for producing a pulse waveform and second means for producing a pulse waveform, said sweep ramp voltage being fed into a display device and into said first means for producing a pulse waveform, said pulse waveform from said first means and said pulse waveform from said second means being fed into a first mixer, a low pass filter and first isolation amplifier electrically connected to said first mixer, said output from said first mixer being fed into said low pass filter and subsequently into said first isolation amplifier, the output from said first isolation amplifier being fed into a device to be tested by said audio frequency sweep generator, a marker pulse generator electrically connected to said first isolation amplifier, the output from said first isolation amplifier also being fed into said marker pulse generator, a second isolation amplifier and a second mixer electrically connected to one another and to said marker pulse generator and to said device under test, the output from said device under test being fed into said second isolation amplifier and subsequently to said second mixer, the pulses from said marker pulse generator also being fed into said second mixer, wherein the output therefrom is fed into said display device, whereby the response of said device under test can be quickly determined.

2. An audio frequency sweep generator as defined in claim 1 wherein said first means for producing a pulse waveform is a free running multivibrator.

3. An audio frequency sweep generator as defined in claim 2 wherein said second means for producing a pulse waveform is a free running multivibrator.

4. An audio frequency sweep generator as defined in claim 3 wherein said means for producing a ramp voltage, said first means for producing a pulse waveform and said second means for producing a pulse waveform each contain a unijunction transistor therein.

5. An audio frequency sweep generator as defined in claim 4 wherein said marker pulse generator has a plurality of channels therein, each of which can be switched on or off independently of the others.

6. An audio frequency sweep generator as defined in claim 5 wherein a third isolation amplifier is electrically connected to said second mixer whereby the pulse produced by said second mixer is fed into said third isolation amplifier and from said third isolation amplifier into said display device.

7. An audio frequency sweep generator as defined in claim 6 further comprising means for adjusting said sweep ramp voltage.

8. An audio frequency sweep generator as defined in claim 7 wherein said marker pulse generator further comprises a plurality of gate transistors electrically connected to said plurality of channels.

9. An audio frequency sweep generator as defined in claim 1 wherein said marker pulse generator has a plurality of channels therein, each of which can be switched on or off independently of the others.

10. An audio frequency sweep generator as defined in claim 9 wherein said marker pulse generator further comprises a plurality of gate transistors electrically connected to said plurality of channels.

* * * * *